(12) United States Patent
Wagemans et al.

(10) Patent No.: US 9,182,097 B2
(45) Date of Patent: Nov. 10, 2015

(54) VARIABLE DIFFUSER

(71) Applicant: KONINKLIJKE PHILIPS N.V., Eindhoven (NL)

(72) Inventors: Wiebe Wagemans, Eindhoven (NL); Floris Maria Hermansz Crompvoets, Bunde (NL); Marc Matysek, Hofheim (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 0 days.

(21) Appl. No.: 14/415,837

(22) PCT Filed: Jul. 10, 2013

(86) PCT No.: PCT/IB2013/055657
§ 371 (c)(1),
(2) Date: Jan. 20, 2015

(87) PCT Pub. No.: WO2014/013389
PCT Pub. Date: Jan. 23, 2014

(65) Prior Publication Data
US 2015/0176796 A1   Jun. 25, 2015

Related U.S. Application Data

(60) Provisional application No. 61/673,972, filed on Jul. 20, 2012.

(51) Int. Cl.
| | | |
|---|---|---|
| G02B 26/00 | (2006.01) | |
| F21V 5/00 | (2015.01) | |
| F21Y 101/02 | (2006.01) | |
| G02B 5/02 | (2006.01) | |
| G02B 5/18 | (2006.01) | |
| G02B 26/02 | (2006.01) | |

(52) U.S. Cl.
CPC ................ *F21V 5/002* (2013.01); *G02B 26/00* (2013.01); *F21Y 2101/02* (2013.01); *G02B 5/0252* (2013.01); *G02B 5/1814* (2013.01); *G02B 5/1828* (2013.01); *G02B 26/02* (2013.01)

(58) Field of Classification Search
CPC ...... G02B 26/00; G02B 26/02; G02B 5/1814; G02B 5/1828; G02B 5/0252
See application file for complete search history.

(56) References Cited

U.S. PATENT DOCUMENTS

| 7,209,280 B2 | 4/2007 | Goossens | |
| 2008/0291521 A1* | 11/2008 | Kim et al. | 359/263 |

(Continued)

FOREIGN PATENT DOCUMENTS

| EP | 2385562 A1 | 11/2011 |
| WO | 2011018728 A1 | 2/2011 |

(Continued)

OTHER PUBLICATIONS

Ronald E. Pelrine et al; "Electrostriction of Polymer Dielectrics With Compliant Electrodes as a Means of Actuation", Sensors and Actuators A, Physical vol. 64, No. 1, 1998, pp. 77-85.

*Primary Examiner* — Joseph P Martinez
(74) *Attorney, Agent, or Firm* — Yuliya Mathis (57) ABSTRACT

The invention relates to a diffuser (1) for use in a lighting device. The diffuser (1) comprises an at least partially transparent first layer (10) and an adjoining at least partially transparent second layer (20), the first layer being continuous and comprising a stretchable elastomer, the second layer being a segmented layer comprising a material with a high effective stiffness measured as the product of the thickness of the material and the elastic modulus of the material. The second layer (20) comprises a non-periodic pattern of segments (21*a*, 21*b*, 21*c*, 21*d*, 21*e*) having different dimensions. The diffuser is stretchable between a first position in which the first layer is in a non-stretched state and the segments of the second layer are arranged adjacent each other such as to form a substantially continuous layer, and a second position in which the first layer is stretched out and the segments of the second layer are separated from each other such that part of the first layer is exposed.

15 Claims, 6 Drawing Sheets

(56) References Cited

U.S. PATENT DOCUMENTS

2009/0310221 A1    12/2009    Aschwanden
2011/0267680 A1    11/2011    Aschwanden

FOREIGN PATENT DOCUMENTS

WO    2011138735 A1    11/2011
WO    2012032447 A1    3/2012

* cited by examiner

VARIABLE DIFFUSER

CROSS-REFERENCE TO PRIOR APPLICATIONS

This application is the U.S. National Phase application under 35 U.S.C. §371 of International Application No. PCT/IB13/055657, filed on Jul. 10, 2013, which claims the benefit of U.S. Provisional Patent Application No. 61/673,972, filed on Jul. 20, 2012. These applications are hereby incorporated by reference herein.

FIELD OF THE INVENTION

In a first aspect the invention relates to a diffuser comprising an at least partially transparent first layer and an adjoining at least partially transparent second layer, the first layer being continuous and comprising a stretchable elastomer, the second layer being a segmented layer comprising a material with a high effective stiffness measured as the product of the thickness of the material and the elastic modulus of the material. In a second and third aspect, respectively, the invention furthermore relates to a lighting device comprising such a diffuser and to a method for producing such a diffuser.

BACKGROUND OF THE INVENTION

Diffusers of the above-mentioned type are widely used in lighting devices, particularly luminaires, for modifying the light emitted by the light source of the lighting device.

US-2011/0267680 A1 describes an optical device comprising a deformable polymer film substrate and a rigid optical element, which in one embodiment is a diffusing structure, provided on the substrate. Electrodes are connected to the substrate in order to enable deformation of the substrate, which in turn enables the rigid optical element to be displaced in the plane of the substrate.

This optical device, however, has static properties which may not be altered after the fabrication process has been concluded. Therefore it is necessary to produce a wide range of different diffusers depending on the modification of light desired and the purpose to be fulfilled in different applications.

SUMMARY OF THE INVENTION

It is an object of the present invention to overcome this problem, and to provide a diffuser having adjustable light diffusing properties.

According to a first aspect of the invention, this and other objects are achieved with a diffuser as described initially and in which the second layer comprises a non-periodic pattern of segments having different dimensions, and in that the diffuser is stretchable between a first position, in which the first layer is in a non-stretched state and the segments of the second layer are arranged adjacent each other such as to form a substantially continuous layer, and a second position, in which the first layer is stretched out and the segments of the second layer are separated from each other such that part of the first layer is exposed.

With such a diffuser it is ensured that the light diffusing properties of the diffuser may be altered after the production process has been finalized as the light diffusing properties are dependent on the degree of stretching of the diffuser. Thereby the user may adjust the light diffusing properties of the diffuser on site, before or even after mounting, according to the particular need. Also a system being simple of construction and cost effective to produce is obtained.

The different dimensions of the segments of the second layer may comprise one or more of width, thickness and length.

In an embodiment the first layer comprises a silicone rubber, an electroactive polymer, a dielectric electroactive polymer, an electroactive elastomer or a dielectric electroactive elastomer, such materials having particularly advantageous properties regarding stretchability, shape memory and durability.

In an embodiment the second layer comprises PEDOT:PSS (poly(3,4-ethylenedioxythiophene) poly(styrenesulfonate)) or a coating layer comprising $SiO_2$ or $SiN$. Such materials have been shown to have particularly advantageous properties suitable for forming a layer having a non-periodic pattern of segments, the properties including a suitable critical strain and brittleness.

In an embodiment the diffuser further comprises at least one actuator element adapted for stretching the first layer in at least one direction being substantially parallel to a surface of the first layer adjoining the second layer.

Thereby a diffuser having a simple construction is provided, with which the light diffusing properties may be adjusted in a simple and convenient manner.

In an embodiment the first layer comprises a silicone rubber, an electroactive polymer, a dielectric electroactive polymer, an electroactive elastomer or a dielectric electroactive elastomer and the at least one actuator element comprises a first electrode arranged on a first surface of the first layer and a second electrode arranged on a second surface of the first layer opposite the first surface.

Thereby a diffuser having a simple construction is provided, with which the light diffusing properties may be adjusted in a particularly simple and convenient manner, simply by adjusting the voltage applied to the electrodes.

In a further embodiment the at least one actuator element comprises a first electrode and a third electrode arranged on a first surface at opposite ends of the first layer and a second electrode and a fourth electrode arranged on a second surface at opposite ends of the first layer opposite the first surface.

In this embodiment the voltage applied to each pair of electrodes need not necessarily be identical, but may just as well be different, thus providing for a further parameter with which to adjust the light diffusing properties of the diffuser in that a non-linear stretch may be obtained.

In an embodiment the first, second, third and/or fourth electrodes are segmented electrodes.

Thereby a diffuser is provided, with which the first stretchable layer may be stretched in more than one direction simultaneously. If, for instance, the first layer is stretched in two directions being mutually perpendicular and furthermore being substantially parallel to the surface of the first layer adjoining the second layer, and the amount of stretch in the two directions is the same, a circular diffusion pattern may be obtained. However, by changing the ratio of the amount of stretch in the two directions, the diffusion pattern becomes elliptical.

In an embodiment the diffuser furthermore comprises an at least partially transparent third layer adjoining the first layer at a surface opposite the second layer, the third layer comprising a non-periodic pattern of segments having different dimensions, the diffuser being stretchable between a first position, in which the first layer is in a non-stretched state and the segments of the third layer are arranged adjacent each other such as to form a substantially continuous layer, and a second position, in which the first layer is stretched out and the segments of the third layer are separated from each other such that part of the first layer is exposed.

The provision of such a third layer provides for a diffuser having light diffusing properties comprising further parameters which may be altered, the further parameters relating to the dimensions of the segments of the third layer. Such a diffuser provides a light output with a more random diffusion effect.

The third layer may comprise PEDOT:PSS (poly(3,4-ethylenedioxythiophene) poly(styrenesulfonate)) or a coating layer comprising $SiO_2$ or SiN.

According to a second aspect of the invention, the above-mentioned object and other objects are achieved with a lighting device comprising a diffuser according to any one of the above claims and at least one light source arranged on a side of the first layer opposite the second layer.

Thereby a lighting device is obtained with which a user, for example a vendor or an end user, may adjust the light diffusing properties of the diffuser on site, before or even after mounting of the lighting device, according to the particular need. Also a system being simple of construction and cost effective to produce is obtained.

In an embodiment of a lighting device according to the invention, the thickness of the second layer is chosen such as to obtain a phase difference of it between an incident beam propagating through the first layer of the diffuser and an incident beam propagating through the first and the second layer of the diffuser, the two incident beams originating from the at least one light source.

According to a third aspect of the invention, the above-mentioned object and other objects are achieved with a method for producing a diffuser according to the invention, the method comprising the steps of:
providing a transparent first layer being continuous and comprising a stretchable elastomer,
applying an at least partially transparent second layer onto the first layer in an non-stretched state of the first layer, the second layer comprising a material with a high effective stiffness measured as the product of the thickness of the material and the elastic modulus of the material, and
stretching the first layer to a range where the second layer fractures into smaller segments such as to provide the second layer with a non-periodic pattern of segments having different dimensions.

It is noted that the invention relates to all possible combinations of features recited in the claims.

BRIEF DESCRIPTION OF THE DRAWINGS

This and other aspects of the present invention will now be described in more detail, with reference to the appended drawings showing embodiment(s) of the invention. In the drawings.

DETAILED DESCRIPTION OF THE EMBODIMENTS

Figure 1A:
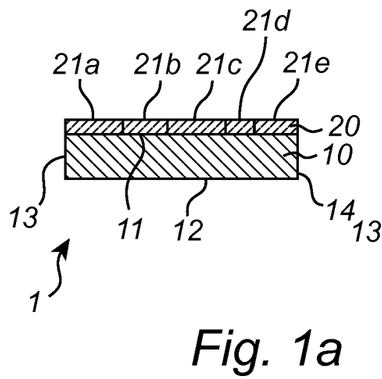
FIGS. 1a and 1b show a side view of a first embodiment of a diffuser according to the first aspect of the invention in a first position corresponding to a non-stretched state and second position corresponding to a stretched state, respectively, a light source and a pair of light beams emitted by said light source being indicated on FIG. 1b.
Figure 1B:
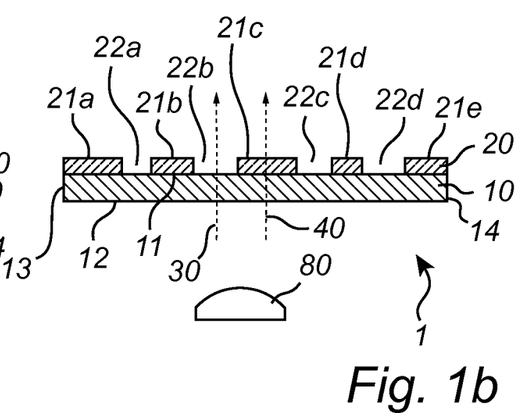
Figure 3:
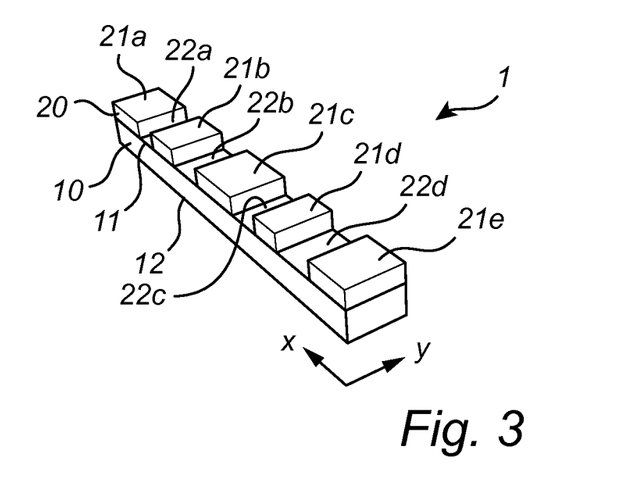
FIG. 3 shows a perspective view of a diffuser according to the embodiment shown in FIGS. 1a and 1b in the stretched state.

FIGS. 1a, 1b and 3 show a first embodiment of a diffuser 1 according to the invention.

The diffuser 1 according to the invention generally comprises a first layer 10 with a first surface 11, a second surface 12, a first end 13 and a second end 14 as well as a second layer 20 adjoining the first layer 10. As shown in FIGS. 1a and 1b, the second layer 20 is provided at the first surface 11 of the first layer 10. Obviously, the second layer 20 may just as well be provided at the second surface 12 instead of at the first surface 11.

The first layer 10 is a continuous layer and comprises a semi-transparent or transparent soft material, preferably an elastomer, which may be stretched between a first position, in which the first layer 10 is in a relaxed or non-stretched state, and a second position, in which the first layer is in a stretched state, such that the first layer is longer and thinner in the second position than it is in the first position. Preferably, the material of the first layer is an electroactive material. Suitable materials for the first layer 10 include, but are not limited to, a silicone rubber, for example those available from NuSil Technology LLC, an electroactive polymer, a dielectric electroactive polymer, an electroactive elastomer or a dielectric electroactive elastomer. The first layer 10 preferably has a thickness of between 1 µm and 3 mm.

The second layer 20 is a segmented layer, and comprises a semi-transparent or transparent material with a high effective stiffness, preferably an effective stiffness being at least 10 times larger than the effective stiffness of the first layer 10. The effective stiffness is given as the product of the thickness of the material and the elastic modulus of the material. Preferably, the material of the second layer 20 has a thickness of between 0.1 micrometer and 1 micrometer, but it may be thicker, and an elastic modulus of between 0.1 and 300 GPa. Suitable materials for the second layer 20 include, but are not limited to, PEDOT:PSS (poly(3,4-ethylenedioxythiophene) poly(styrenesulfonate)) or a coating layer comprising $SiO_2$ or SiN.

Preferable combinations of materials have been shown to include a silicone rubber coated with PEDOT:PSS or with a combination of $SiO_2$ or SiN.

As shown on the figures, the second layer 20 furthermore comprises a non-periodic pattern of segments 21a, 21b, 21c, 21d, 21e having different dimensions, such dimensions encompassing the thickness, width and length of the segments and any combination thereof. Also, any number of segments larger than one is feasible. Furthermore, a diffuser according to the invention may comprise a second layer 20 with more than one row of segments, and the segments of the different rows may be offset relative to one another.

When the first layer 10, and thereby the diffuser 1, is in the first position, in which the first layer 10 is in a non-stretched state, the segments 21a, 21b, 21c, 21d, 21e of the second layer 20 are arranged adjacent each other such as to form a substantially continuous layer, cf. FIG. 1a. In other words, the segments 21a, 21b, 21c, 21d, 21e of the second layer 20 are shaped such that the fit together in the relaxed or non-stretched state of the diffuser 1.

When the first layer 10, and thereby the diffuser 1, is in the second position, in which the first layer 10 is in a stretched state, the segments 21a, 21b, 21c, 21d, 21e of the second layer 20 are separated from each other by gaps 22a, 22b, 22c, 22d such that part of the first layer 10 is exposed, cf. FIG. 1b. The gaps 22a, 22b, 22c, 22d may have different dimensions, particularly lengths and/or widths.

Figure 2A:
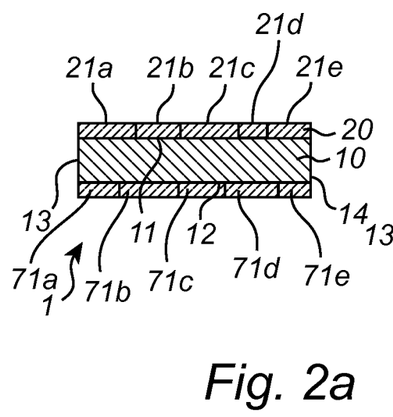
FIGS. 2a and 2b show a side view of a second embodiment of a diffuser according to the first aspect of the invention in a first position corresponding to a non-stretched state and second position corresponding to a stretched state, respectively, a light source and a pair of light beams emitted by said light source being indicated on FIG. 2b.
Figure 2B:
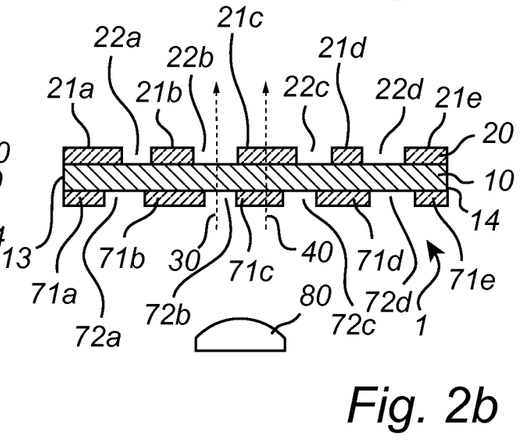

FIGS. 2a and 2b show a second embodiment of a diffuser 1 according to the invention in views similar to those of FIGS. 1a and 1b. The diffuser 1 according to the second embodiment of the invention differs from the diffuser according to the first embodiment in one respect only. Namely, the diffuser 1 according to the second embodiment comprises a third layer 70 adjoining the first layer 10 at a surface opposite the surface at which the second layer 20 adjoins the first layer 10. As shown in FIGS. 2a and 2b, the third layer 70 is provided at the second surface 12 of the first layer 10, while the second layer 20 is provided at the first surface 11 of the first layer 10. Obviously, in embodiments in which the second layer 20 is provided at the second surface 12, the third layer 70 may just as well be provided at the first surface 11.

The third layer 70 is a segmented layer, and comprises a semi-transparent or transparent material with a high effective stiffness, preferably an effective stiffness being at least 10 times larger than the effective stiffness of the first layer 10. The effective stiffness is given as the product of the thickness of the material and the elastic modulus of the material. Preferably, the material has a thickness of between 0.1 micrometer and 1 micrometer, but it may be thicker, and an elastic modulus of between 0.1 and 300 GPa. Suitable materials for the third layer 70 include, but are not limited to, PEDOT:PSS (poly(3,4-ethylenedioxythiophene) poly(styrenesulfonate)) or a coating layer comprising $SiO_2$ or SiN.

As shown on FIGS. 2a and 2b, the third layer 70 furthermore comprises a non-periodic pattern of segments 71a, 71b, 71c, 71d, 71e having different dimensions, such dimensions encompassing the thickness, width and length of the segments and any combination thereof.

When the first layer 10, and thereby the diffuser 1, is in the first position, in which the first layer 10 is in a non-stretched state, the segments 71a, 71b, 71c, 71d, 71e of the third layer 70 are arranged adjacent each other such as to form a substantially continuous layer, cf. FIG. 2a. In other words, the segments 71a, 71b, 71c, 71d, 71e of the third layer 70 are shaped such that the fit together in the relaxed or non-stretched state of the diffuser 1.

When the first layer 10, and thereby the diffuser 1, is in the second position, in which the first layer 10 is in a stretched state, the segments 71a, 71b, 71c, 71d, 71e of the third layer 70 are separated from each other by gaps 72a, 72b, 72c, 72d such that part of the first layer 10 is exposed, cf. FIG. 2b. The gaps 72a, 72b, 72c, 72d may have different dimensions, particularly lengths and/or widths.

The third layer 70 may be identical to or different from the second layer 20 regarding choice of materials and/or dimensions of the segments 71a, 71b, 71c, 71d, 71e. Likewise, the arrangement of the pattern of segments 71a, 71b, 71c, 71d, 71e of the third layer 70 may be identical to or different from that of the second layer 20. Referring now to FIGS. 1b and 2b, respectively, a light source 80 and a pair of light beams 30, 40 emitted by the light source 80 has been indicated thereon, thereby schematically illustrating a generalized embodiment of a lighting device according to the second aspect of the invention.

The light source 80 may be any feasible type of light source, for example one or more LEDs or light bulbs, or even an array of light sources.

As may be seen on FIG. 1b, the first light beam 30 propagates through the first layer 10 and a gap 22b between the segments 21b and 21c of the second layer 20, while the second light beam 40 propagates through the first layer 10 and the segment 21c of the second layer 20.

Thus, the optical path length of the second light beam 40 is longer than that of the first light beam 30. These differences in optical path length create constructive and destructive interference. Because the dimensions of the segments and the dimensions of the gaps are not constant, a uniform and thus diffuse diffraction pattern is obtained.

Similarly, as may be seen on FIG. 2b, the first light beam 30 propagates through the first layer 10, the gap 22b between segments 21b and 21c of the second layer 20 and the gap 72b between segments 71b and 71c of the third layer 70, while the second light beam 40 propagates through the segment 71c of the third layer 70, the first layer 10 and the segment 21c of the second layer 20. Thereby a larger difference in optical path length may be obtained. Obviously it is also feasible, depending on the size and arrangement of the respective segments, that a light beam may propagate through only one segment of either the third layer 70 or the second layer 20.

Turning now to FIGS. 4a, 4b, 5a and 5b a diffuser 1 according to the first embodiment of the invention and comprising an actuator element 50 is shown. The actuator element 50 is adapted for stretching the first layer 10 in a radial direction (FIGS. 4a and 4b) or in at least one direction x, y (FIGS. 5a and 5b, and also being indicated on FIG. 3) being substantially parallel to the first surface 11 of the first layer 10 adjoining said second layer 20.

Figure 4A:
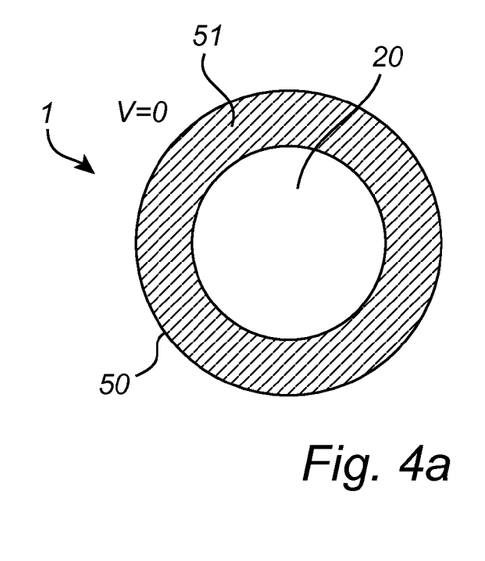
FIGS. 4a and 4b show a top view of the first embodiment of a diffuser according to the first aspect of the invention in a first position corresponding to a non-stretched state and second position corresponding to a stretched state, respectively, the diffuser being provided with an actuator element in the form of a pair of circular electrodes.
Figure 4B:
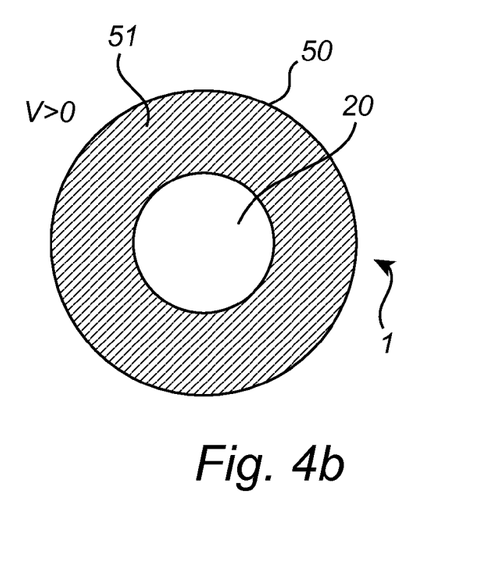

In the embodiment shown in FIGS. 4a and 4b, the actuator element 50 is a pair of circular electrodes and the first layer 10 comprises an electroactive elastomer or polymer. A first circular electrode 51 is arranged along a periphery of the first layer 10 of the diffuser 1 which is likewise circular of shape, on the first surface 11 of the first layer 10, and encircling the second layer 20. A second circular electrode (not shown) is arranged in a similar way on the second surface 12 of the first layer 10 of the diffuser 1. When applying a voltage to the pair of circular electrodes (FIG. 4b) the part of the first layer being arranged between the electrodes is stretched, and the diffuser structure inside the circular electrode is consequently pushed towards the first, non-stretched position. Thereby the diffuser becomes more transparent. In the embodiment shown in FIGS. 4a and 4b, the diffuser may be stretched in all directions falling within the plane of the first surface 11 simultaneously.

It is noted that the pair of electrodes may in principle have any shape, for example rectangular or triangular, conforming to following the periphery of the first layer of the diffuser. Also, electrodes that extend along substantially the whole periphery of the first layer of the diffuser, i.e. that are missing one or more segments, are feasible.

Figure 5A:
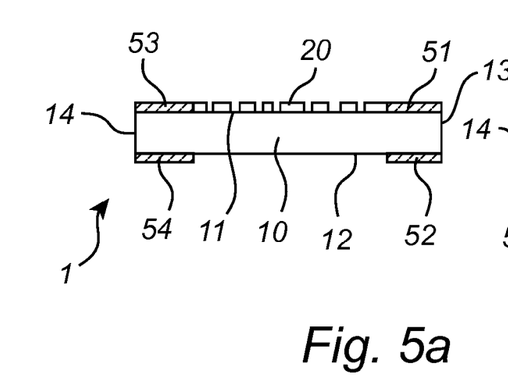
FIGS. 5a and 5b show a side view of the first embodiment of a diffuser according to the first aspect of the invention in a first position corresponding to a non-stretched state and second position corresponding to a stretched state, respectively, the diffuser being provided with an actuator element in the form of two pairs of electrodes.
Figure 5B:
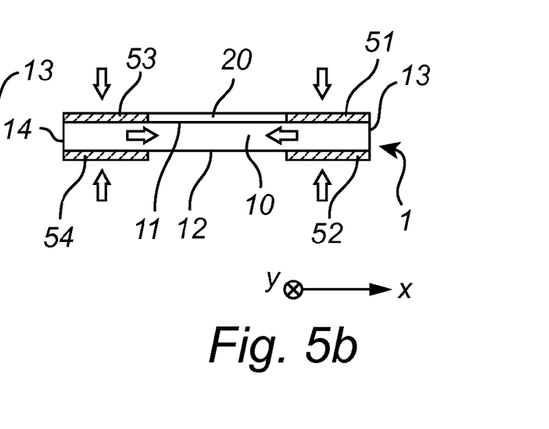

In the embodiment shown in FIGS. 5a and 5b, the first layer 10 comprises an electroactive elastomer or polymer and the actuator element 50 comprises a first electrode 51 and a second electrode 52 arranged on the first surface 11 and on the second surface 12, respectively, at the first end 13 of the first layer 10 thus forming a first pair of electrodes 51, 52. The actuator element 50 furthermore comprises a third electrode 53 and a fourth electrode 54 arranged on the first surface 11 and on the second surface 12, respectively, at the second end 14 of the first layer 10, thus forming a second pair of electrodes 53, 54. When applying a voltage to the respective pairs of electrodes 51, 52; 53, 54 the part of the first layer being arranged between the respective pairs of electrodes is stretched, and the diffuser structure between the pairs of electrodes is consequently pushed towards the first, non-stretched position, primarily in a direction extending between the pairs of electrodes.

Preferably, the electrodes are stretchable electrodes made of a material being compliant enough not to restrict actuator movement and deformable enough not to break or fail during actuation. Such electrodes may for example be thin film electrodes coated or printed on the first layer of the diffuser.

Thus, the actuator elements 50 shown in FIGS. 4a, 4b, 5a and 5b are essentially different embodiments of a so-called dielectric electroactive polymer (DEA) actuator integrated with a diffuser 1 as shown in FIGS. 1a and 1b.

DEA actuators are a type of actuator known per se, which generally speaking are thin film actuators consisting of a sandwich of traditionally two stretchable electrodes with a soft elastomer in between. The stretchable electrodes are compliant enough not to restrict actuator movement and deformable enough not to break or fail during actuation. The basic functionality of a polymer actuator is a controllable stretch motion under influence of a driving voltage. When applying a voltage, the stretchable electrode surfaces of a DEA actuator grow larger while the thickness of soft elastomer becomes smaller due to incompressibility of the elastic polymer. The actuation is based on electrostatic pressure balanced by mechanical pressure and works as follows. When a voltage, and thereby an additional charge, is applied to the electrodes, the electrodes will attract each other and the distance between them decreases by an amount depending on the magnitude of the additional charge. An equilibrium state is reached when the electrostatic pressure is counterbalanced by the mechanical pressure of the compressed soft elastomer.

As a further possibility, the electrodes may be segmented electrodes, i.e. electrodes comprising two or more mutually separated segments. Also, the electrodes may in principle have any feasible shape.

Naturally any number of electrodes or electrode pairs may in principle be provided, including one pair and three or more pairs. Also, all electrode pairs need not necessarily be applied the same voltage.

Furthermore, other actuator means 50, such as mechanical actuating means based for example on springs, magnets or any other means suitable for stretching the first layer 10 may likewise be employed. It is even feasible, that the diffuser may be stretched by hand, i.e. the actuator element may be the fingers or hands of a user employed for manually stretching the first layer.

Figure 6A:
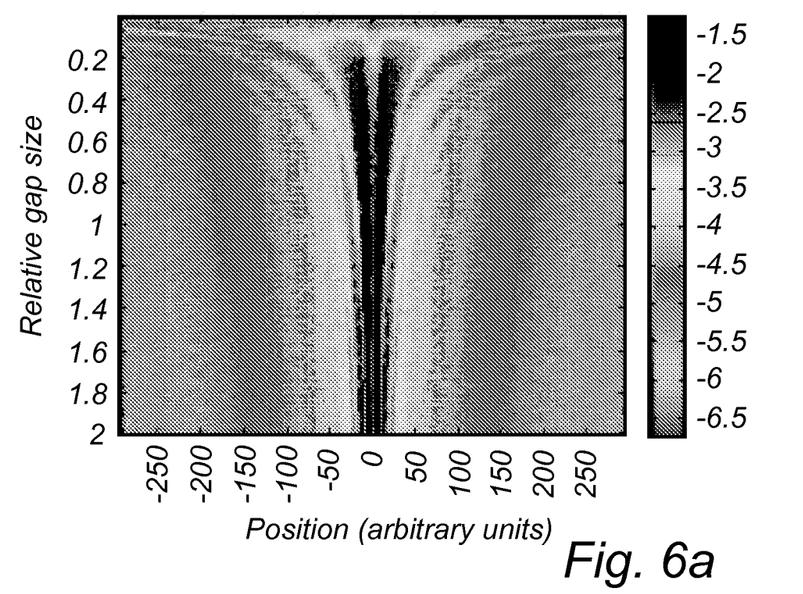
FIG. 6a shows an exemplary illustration of a simulation of the light intensity of light transmitted by a diffuser according to the invention as a function of relative gap size of the diffuser, in which the segments have a thickness chosen to obtain a phase difference between two beams of light propagating through the diffuser of $\pi$.
Figure 6B:
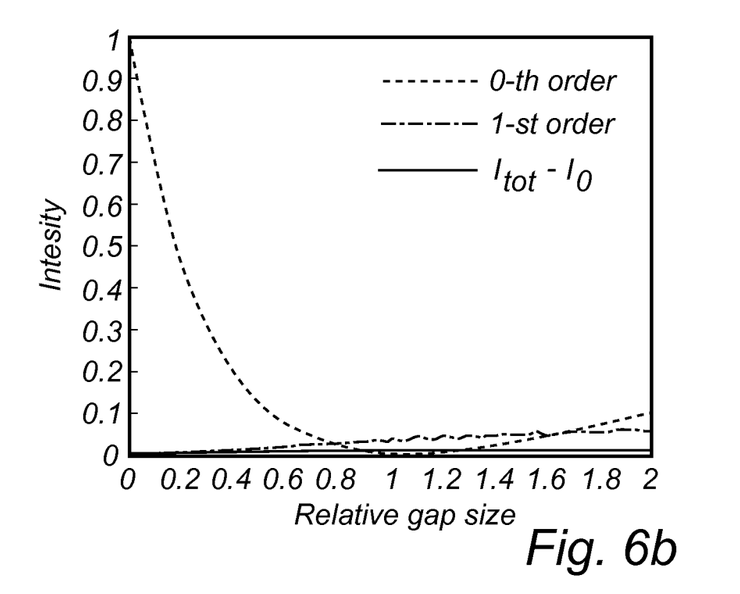
FIGS. 6b to 6d show illustrations of measurements of the light intensity of light being directly transmitted (zeroth order) and of light being shifted one order (first order) when transmitted as a function of relative gap size of a diffuser according to the invention in which the segments have a thickness chosen to obtain a phase difference between two beams of light propagating through the diffuser of $\pi$, $\frac{1}{2}\pi$ and $\frac{2}{3}\pi$, respectively.
Figure 6C:
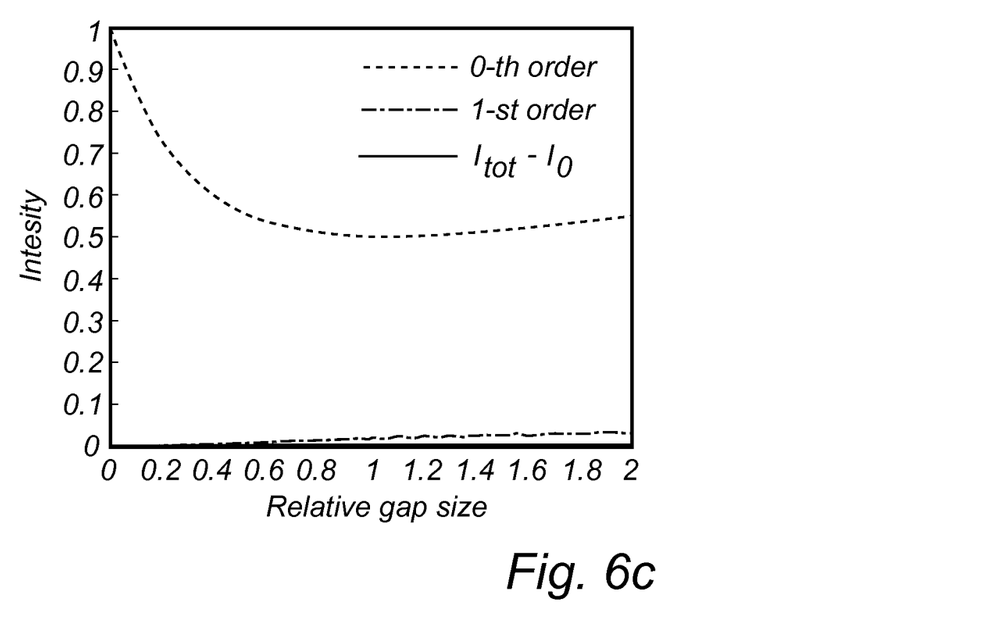
Figure 6D:
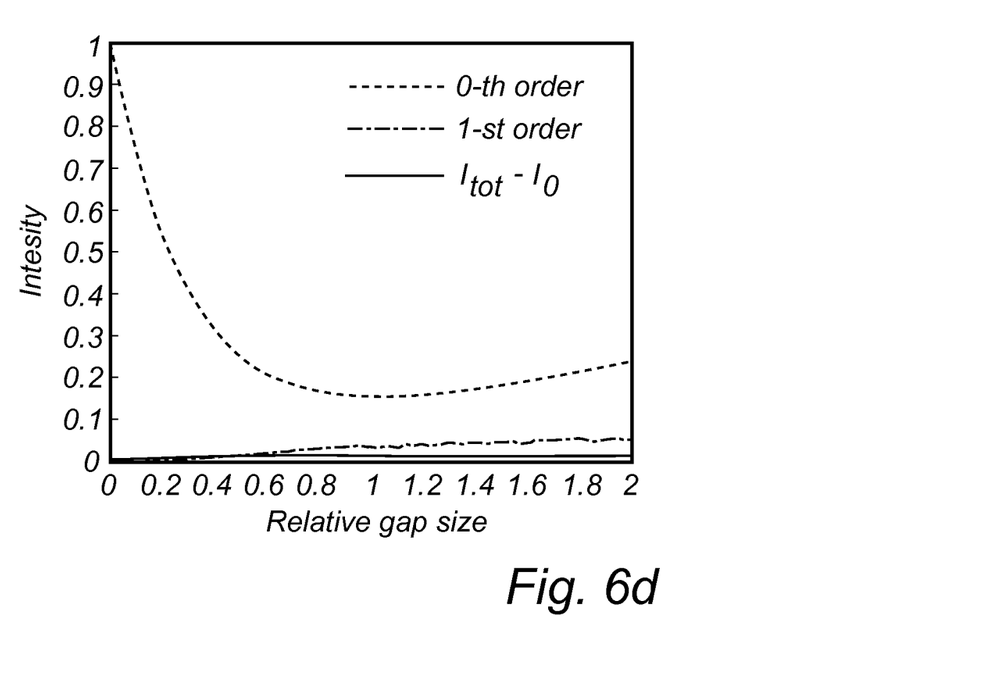

Turning now to FIGS. 6a to 6d an example of simulations made on a lighting device comprising a diffuser according to the first embodiment of the invention is shown to illustrate the importance of the thickness of the second layer 20. In principle the same considerations apply to the thickness of the third layer 70. FIG. 6a shows a simulation of the intensity profile of the light transmitted through the diffuser as a function of the relative gap size. The simulation covers only the diffractive effects of the diffuser. It is in this connection noted that scattering effects of the diffuser also occur. The zeroth order transmitted light is not plotted. FIGS. 6b, 6c and 6d show the maximum intensity of the zeroth and the first order transmitted light as a function of the relative gap size for a phase difference of $\pi$, $\frac{1}{2}\pi$ and $\frac{3}{4}\pi$, respectively.

The thickness of the segments of the second layer 20 plays an important role in the suppression of the zeroth order transmitted light, i.e. the directly transmitted light. This is illustrated in the graphs shown in FIGS. 6b, 6c and 6d. The thickness determines the phase difference between the light propagating only through the elastomer and light that also propagates through a segment. If this phase difference is exactly $\pi$, the zeroth order transmitted light is canceled out when the stretch is such that the length of the elements and the gaps is equal, corresponding to a relative gap size of 1 (FIG. 6b). When the phase difference is different from $\pi$, a minimum is still reached at the same stretch, but a 0-th order transmitted light contribution is still present. This is illustrated in FIGS. 6c and 6d, in which the phase difference is chosen to $\frac{1}{2}\pi$ and $\frac{3}{4}\pi$, respectively.

Turning now towards FIGS. 7, 8, 9a, 9b and 10 an example of a diffuser according to the invention will be described. The diffuser was made by coating a layer of about 100 nm of PEDOT:PSS on a substrate made of a silicone rubber obtained from NuSil Technology LLC, then stretching the diffuser in one direction. With reference to the atomic force microscopy picture shown on FIG. 7, the diffuser was stretched in the direction x indicated on FIG. 7, resulting in the three gaps shown, which extend in the direction y indicated on FIG. 7. This stretch is accompanied by a compression in the vertical direction, giving rise to wrinkling of the film in this direction. It is evident from FIG. 7 as well as from FIG. 8, which shows a graph representing a cross section in the direction x through the diffuser shown in FIG. 7, that the widths of the PEDOT:PSS elements, i.e. of the segments of the second layer of the diffuser, and of the gaps are neither periodic nor constant.

Figure 7:
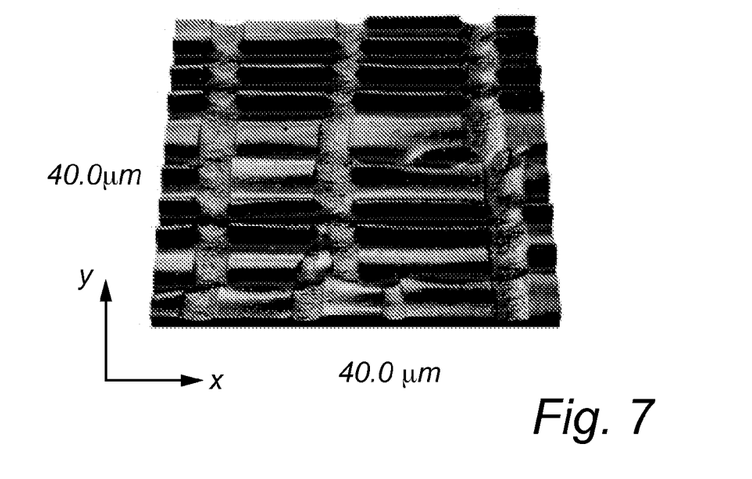
FIG. 7 shows an atomic force microscopy (AFM) picture of a diffuser according to the invention made of about 100 nm PEDOT:PSS on a silicone rubber obtained from NuSil Technology LLC.
Figure 8:
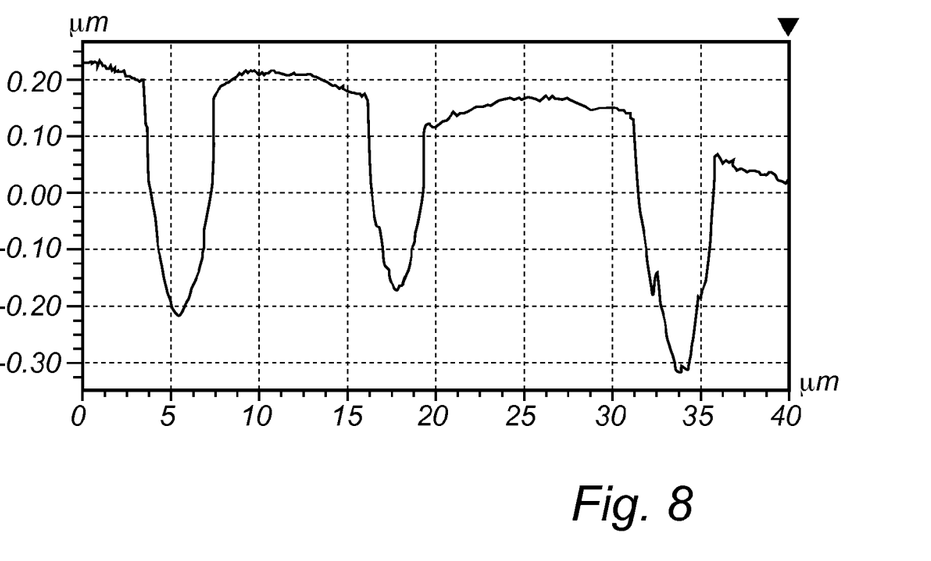
FIG. 8 shows a graph representing a cross section in the direction x through the diffuser shown in FIG. 7.
Figure 9A:
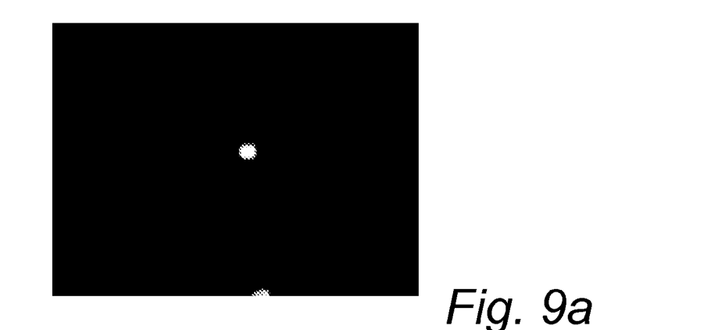
FIGS. 9a and 9b shows a projection of a beam of collimated light through the diffuser shown in FIG. 7 in an unstretched state and a state stretched in one direction, respectively.
Figure 9B:
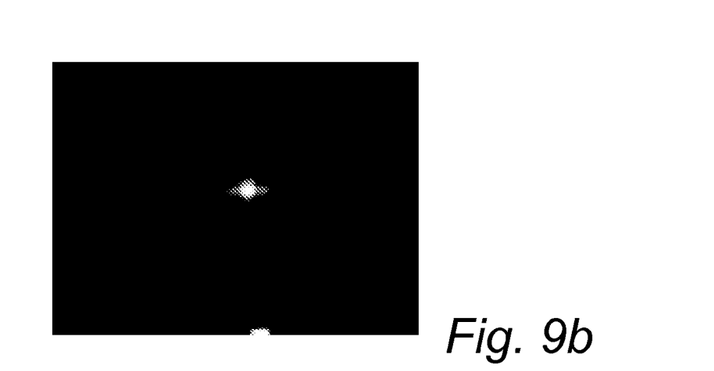

FIGS. 9a and 9b show the projection of a beam of collimated light through the diffuser shown in FIG. 7. Without any stretching, as illustrated in FIG. 9a, no diffusion occurs and a square light spot is seen. When the structure is stretched in the direction x a broad diffusive spot is seen in this direction as illustrated in FIG. 9b. In the direction perpendicular to the direction x, i.e. direction y, a rainbow pattern is seen due to the wrinkling of the film in this direction. Because this wrinkling occurs with a well defined period the different colors will appear (similar to a diffraction grating), unlike in the direction x where these are all mixed to white. In a product it these colors due to wrinkling are unwanted. This can be prevented by a (small) stretch in the direction y.

Figure 10:
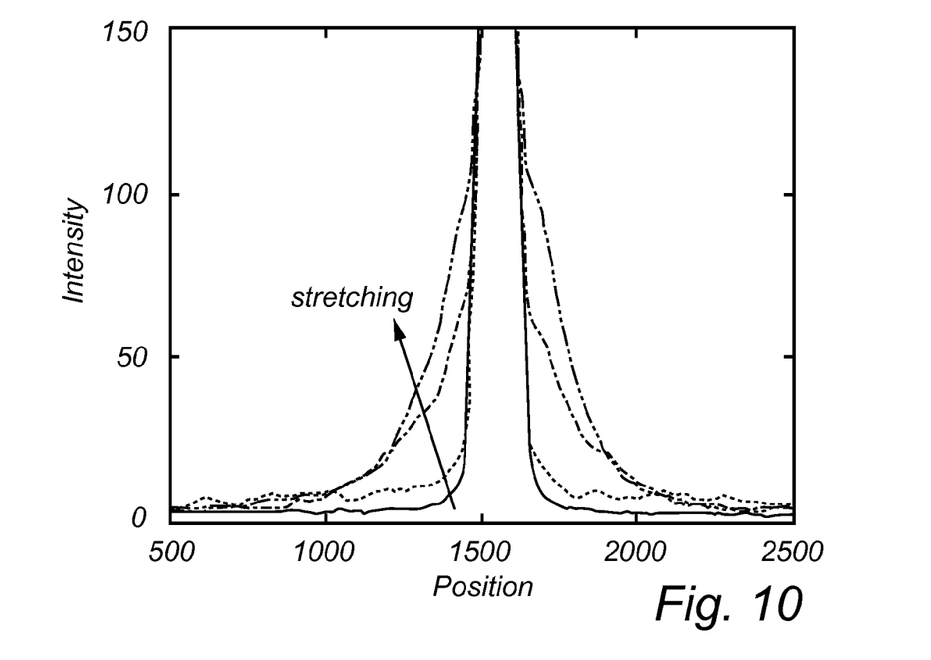
FIG. 10 shows an exemplary illustration of a measurement of the light intensity of light transmitted by the diffuser shown in FIG. 7 as a function of relative gap size.

FIG. 10 shows a measurement of the intensity profile of the light transmitted through the diffuser shown in FIG. 7 as a function of the relative gap size. The intensity profile shown in FIG. 10 is similar to that of FIG. 6a. The narrowest of the four peaks shown corresponds to a gap size of zero, i.e. the unstretched state of the diffuser. The larger the gap size, i.e. the larger the stretch, the wider the peak becomes as illustrated by the arrow marked "stretching".

In the following a method for producing a diffuser 1 according to the invention will be described.

In a first step a transparent first layer 10 being continuous and comprising a stretchable elastomer is provided. In subsequent steps, an at least partially transparent second layer 20 is applied onto the first layer 10 in an non-stretched state of the first layer 10, the second layer 20 comprising a material with a high effective stiffness measured as the product of the thickness of the material and the elastic modulus of the material, and the first layer 10 is stretched to a range where the second layer 20 fractures into smaller segments such as to provide the second layer 20 with a non-periodic pattern of segments 21a, 21b, 21c, 21d, 21e having different dimensions.

In this case the pattern of segments is randomly created. It is also possible to pre-define the positions where fracture can occur by locally weakening the structure of the second layer 20, for instance by creating small grooves to locally reduce the thickness. This can for instance be achieved by a stamp or by structuring the first layer 10 before applying the second layer 20. This also applies to the third layer 70 described below.

The method according to the invention may comprise any one or more of the further steps of providing the diffuser 1 with at least one actuator element 50, or applying an at least partially transparent third layer 70 onto a surface 12 of the first layer 10 opposite the second layer 20 in an non-stretched state of the first layer 10, the third layer 70 comprising a material with a high effective stiffness measured as the product of the thickness of the material and the elastic modulus of the material, and stretching the first layer 10 to a range where the third layer 70 fractures into smaller segments such as to provide the third layer 70 with a non-periodic pattern of segments 71a, 71b, 71c, 71d, 71e having different dimensions.

The step of stretching the first layer may be performed separately for each of the second layer 20 and the third layer 70, or it may be performed once to simultaneously provide the second layer 20 and the third layer 70 with a non-periodic pattern of segments.

Furthermore, the step of providing the diffuser 1 with at least one actuator element 50 may comprise providing, in a stretched condition of the first layer 10, the first layer 10 with at least a first electrode 51 arranged on a first surface 11 of the first layer 10 and a second electrode 52 arranged on a second surface 12 of the first layer 10 opposite the first surface 11, thereby providing a first pair of electrodes. Obviously further pairs of electrodes may also be provided, and the respective electrodes may be segmented electrodes as described above.

The person skilled in the art realizes that the present invention by no means is limited to the preferred embodiments described above. On the contrary, many modifications and variations are possible within the scope of the appended claims.

The invention claimed is:

1. A diffuser comprising an at least partially transparent first layer and an adjoining at least partially transparent second layer, the first layer being continuous and comprising a stretchable elastomer, the second layer being a segmented layer comprising a material with a high effective stiffness measured as the product of the thickness of the material and the elastic modulus of the material,
    wherein the second layer comprises a non-periodic pattern of segments having different dimensions, and
    wherein the diffuser is stretchable between a first position in which the first layer is in a non-stretched state and the segments of the second layer are arranged adjacent each other such as to form a substantially continuous layer, and a second position in which the first layer is stretched out and the segments of the second layer are separated from each other such that part of the first layer is exposed.

2. A diffuser according to claim 1, wherein the different dimensions of the segments of the second layer comprise one or more of width, thickness and length.

3. A diffuser according to claim 1, wherein the first layer comprises a material chosen from the group consisting of a silicone rubber, an electroactive polymer, a dielectric electroactive polymer, an electroactive elastomer and a dielectric electroactive elastomer.

4. A diffuser according to claim 1, wherein the second layer comprises PEDOT:PSS or a coating layer comprising SiO2 and SiN.

5. A diffuser according to claim 1, further comprising at least one actuator element adapted for stretching the first layer in at least one direction being substantially parallel to a first surface of the first layer adjoining the second layer.

6. A diffuser according to claim 5, wherein the first layer comprises a material chosen from the group consisting of a silicone rubber, an electroactive polymer, a dielectric electroactive polymer, an electroactive elastomer and a dielectric electroactive elastomer, and wherein the at least one actuator element comprises a first electrode arranged on a first surface of the first layer and a second electrode arranged on a second surface of the first layer opposite the first surface.

7. A diffuser according to claim 5, wherein the at least one actuator element comprises a first electrode and a third electrode arranged on a first surface at opposite ends of the first layer and a second electrode and a fourth electrode arranged on a second surface at opposite ends of the first layer opposite said first surface.

8. A diffuser according to any of claim 6, wherein the first, second, third and/or fourth electrodes are segmented electrodes.

9. A diffuser according to claim 1, furthermore comprising an at least partially transparent third layer adjoining the first layer at a surface opposite the second layer, the third layer comprising a non-periodic pattern of segments having different dimensions, wherein the diffuser is stretchable between a first position in which the first layer is in a non-stretched state and the segments of the third layer are arranged adjacent each other such as to form a substantially continuous layer, and a second position in which the first layer is stretched out and the segments of the third layer are separated from each other such that part of the first layer is exposed.

10. A diffuser according to claim 9, wherein the third layer comprises PEDOT:PSS or a coating layer comprising SiO2 and SiN.

11. A lighting device comprising a diffuser according to claim 10 and at least one light source arranged on a side of the first layer opposite the second layer.

12. A lighting device according to claim 11, wherein the thickness of the second layer is chosen such as to obtain a phase difference of $\pi$ between an incident beam propagating through the first layer of the diffuser and an incident beam propagating through the first and the second layer of the diffuser, the two incident beams originating from the at least one light source.

13. A method for producing a diffuser according to claim 10, comprising the steps of:
- providing a transparent first layer being continuous and comprising a stretchable elastomer,
- applying an at least partially transparent second layer onto the first layer in a non-stretched state of the first layer, the second layer comprising a material with a high effective stiffness measured as the product of the thickness of the material and the elastic modulus of the material, and
- stretching the first layer to a range where the second layer fractures into smaller segments such as to provide the second layer with a non-periodic pattern of segments having different dimensions.

14. A method according to claim 13, further comprising the step of providing the diffuser with at least one actuator element.

15. A method according to claim 14, wherein the step of providing the diffuser with at least one actuator element comprises providing, in a stretched condition of the first layer, the first layer with at least a first electrode arranged on a first surface of the first layer and a second electrode arranged on a second surface of the first layer opposite said first surface.

\* \* \* \* \*